(12) United States Patent
Matsuo

(10) Patent No.: US 11,309,680 B2
(45) Date of Patent: Apr. 19, 2022

(54) LIGHT SOURCE DEVICE INCLUDING LEAD TERMINALS THAT CROSS SPACE DEFINED BY BASE AND CAP

(71) Applicant: NICHIA CORPORATION, Anan (JP)

(72) Inventor: Hidenori Matsuo, Hadano (JP)

(73) Assignee: NICHIA CORPORATION, Anan (JP)

(*) Notice: Subject to any disclaimer, the term of this patent is extended or adjusted under 35 U.S.C. 154(b) by 61 days.

(21) Appl. No.: 16/144,827

(22) Filed: Sep. 27, 2018

(65) Prior Publication Data

US 2019/0097388 A1   Mar. 28, 2019

(30) Foreign Application Priority Data

Sep. 28, 2017  (JP) .............................. JP2017-188531
Sep. 25, 2018  (JP) .............................. JP2018-178783

(51) Int. Cl.
*H01S 5/02234* (2021.01)
*H01S 5/02216* (2021.01)
(Continued)

(52) U.S. Cl.
CPC .......... *H01S 5/02234* (2021.01); *H01S 5/023* (2021.01); *H01S 5/0233* (2021.01); *H01S 5/0235* (2021.01); *H01S 5/02216* (2013.01); *H01S 5/02255* (2021.01); *H01S 5/02257* (2021.01); *H01S 5/0232* (2021.01);
(Continued)

(58) Field of Classification Search
CPC ............. H01S 5/02216; H01S 5/02244; H01S 5/02292; H01S 5/02296; H01S 5/005; H01S 5/02236; H01S 5/0683; H01S 5/02228; H01S 5/02248; H01S 5/02276; H01S 5/02208; H01S 5/02476; H01S 5/02469; H01S 5/02234; H01S 5/02255; H01S 5/02257; H01S 5/023; H01S 5/0233;
(Continued)

(56) References Cited

U.S. PATENT DOCUMENTS 5,307,362 A * 4/1994 Tanaka .................... H01L 24/97
                                                          372/50.1
5,309,460 A * 5/1994 Fujimaki ............... H01S 5/0231
                                                            372/36
(Continued)

FOREIGN PATENT DOCUMENTS

| JP | H06-350131 A | 12/1994 |
| JP | 2006-128694 A | 5/2006 |
| JP | 2012-070007 A | 4/2012 |

*Primary Examiner* — M. A. Golub-Miller
(74) *Attorney, Agent, or Firm* — Foley & Lardner LLP

(57) ABSTRACT

A light source device includes: a base comprising a bottom portion and a peripheral wall portion; a semiconductor laser located on the bottom portion; a cap connected to an upper surface of the peripheral wall portion, wherein the cap and the base define a sealed space; a translucent portion located in the peripheral wall portion or the cap, the translucent portion being configured to transmit a beam emitted from the semiconductor laser; and first and second lead terminals located in the sealed space and crossing from a first inner surface of the peripheral wall portion to a second inner surface of the peripheral wall portion. The semiconductor laser is located between the two lead terminals. The translucent portion is located on an optical axis of the beam emitted from the semiconductor laser.

10 Claims, 7 Drawing Sheets

(51) Int. Cl.
  *H01S 5/023* (2021.01)
  *H01S 5/0233* (2021.01)
  *H01S 5/0235* (2021.01)
  *H01S 5/02255* (2021.01)
  *H01S 5/02257* (2021.01)
  *H01S 5/024* (2006.01)
  *H01S 5/0683* (2006.01)
  *H01S 5/02208* (2021.01)
  *H01S 5/02325* (2021.01)
  *H01S 5/02345* (2021.01)
  *H01S 5/0232* (2021.01)

(52) U.S. Cl.
  CPC ....... *H01S 5/02208* (2013.01); *H01S 5/02325* (2021.01); *H01S 5/02345* (2021.01); *H01S 5/02469* (2013.01); *H01S 5/02476* (2013.01); *H01S 5/0683* (2013.01)

(58) Field of Classification Search
  CPC .. H01S 5/0235; H01S 5/0232; H01S 5/02325; H01S 5/02345
  See application file for complete search history.

(56) References Cited

U.S. PATENT DOCUMENTS

| | | | | |
|---|---|---|---|---|
| 5,327,443 A * | 7/1994 | Tanaka | ................ | H01S 5/02255 372/36 |
| 5,557,116 A * | 9/1996 | Masui | .................. | H01S 5/0231 257/100 |
| 5,617,439 A * | 4/1997 | Kakimoto | ............. | H01S 5/0264 257/84 |
| 5,748,658 A * | 5/1998 | Nakanishi | ............. | H01S 5/0231 372/43.01 |
| 6,778,576 B1 * | 8/2004 | Acklin | ................ | H01S 5/02345 372/50.1 |
| 6,970,486 B2 * | 11/2005 | Nakata | ................ | H01S 5/02325 372/36 |
| 7,875,901 B2 * | 1/2011 | Fujino | .................. | H01S 5/0231 257/99 |
| 2002/0009112 A1 * | 1/2002 | Nakata | ................ | H01S 5/02325 372/50.1 |
| 2003/0123499 A1 * | 7/2003 | Ohgiyama | ............. | G11B 7/082 372/36 |
| 2006/0093305 A1 | 5/2006 | Lim et al. | | |
| 2007/0091945 A1 * | 4/2007 | Ferstl | .................. | H01S 5/02216 372/38.1 |
| 2007/0278511 A1 * | 12/2007 | Ohno | ...................... | H01L 33/62 257/99 |
| 2011/0280266 A1 * | 11/2011 | Hayashi | .............. | H01S 5/02216 372/43.01 |
| 2012/0224817 A1 * | 9/2012 | Hayashi | ............... | G02B 6/4206 385/93 |
| 2014/0226689 A1 * | 8/2014 | Takeda | ................ | H01S 5/02257 372/43.01 |
| 2015/0003482 A1 * | 1/2015 | Monadgemi | .......... | H01S 5/0222 372/44.01 |
| 2015/0155944 A1 * | 6/2015 | Lee | ..................... | H01S 5/02345 372/34 |
| 2015/0255949 A1 * | 9/2015 | Lee | ..................... | H01S 5/02407 372/36 |
| 2016/0359296 A1 * | 12/2016 | Wong | ................. | G02B 19/0019 |
| 2017/0288366 A1 * | 10/2017 | Hazeghi | ................. | H01S 5/023 |
| 2017/0338628 A1 * | 11/2017 | Matsushita | ........... | H01S 5/4025 |
| 2018/0331492 A1 * | 11/2018 | Itoh | ...................... | H01S 5/02234 |
| 2019/0058303 A1 * | 2/2019 | Miura | ..................... | H01S 5/028 |
| 2019/0234565 A1 * | 8/2019 | Kitajima | .............. | H01S 5/02257 |
| 2019/0324222 A1 * | 10/2019 | Kettler | ..................... | H01S 5/02 |

* cited by examiner

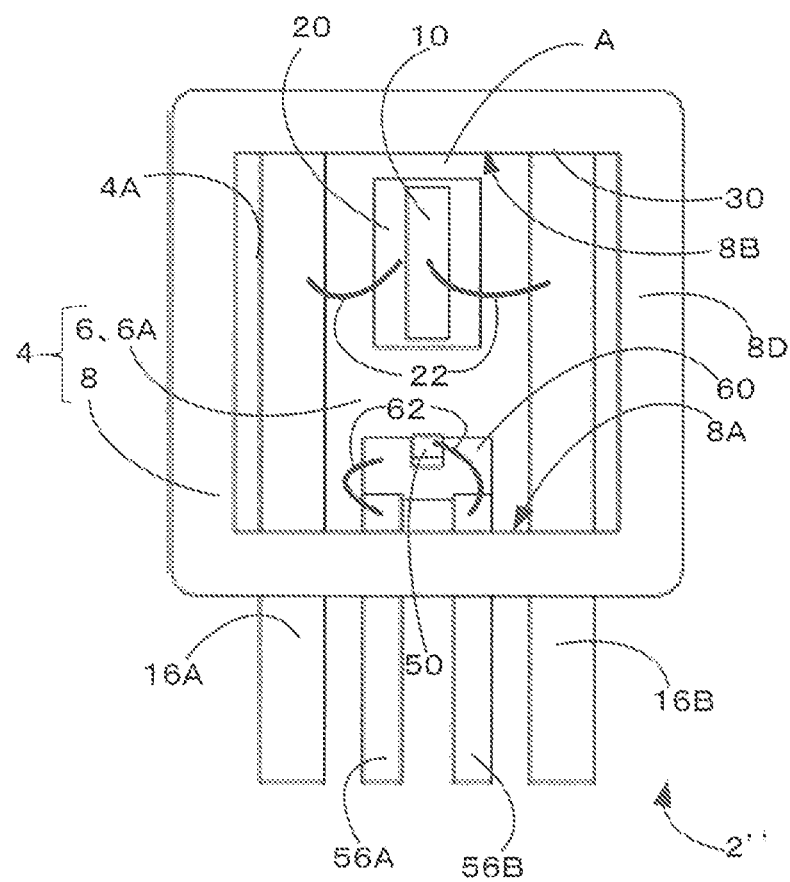

US 11,309,680 B2

LIGHT SOURCE DEVICE INCLUDING LEAD TERMINALS THAT CROSS SPACE DEFINED BY BASE AND CAP

CROSS-REFERENCE TO RELATED APPLICATIONS

This application claims priority to Japanese Patent Application No. 2017-188531, filed on Sep. 28, 2017, Japanese Patent Application No. 2018-178783, filed on Sep. 25, 2018, the disclosures of which are hereby incorporated by reference in their entireties.

BACKGROUND

(1) Field of the Invention

The present disclosure relates to a light source device including a semiconductor laser.

(2) Description of Related Art

Light source devices including semiconductor lasers are used in various industrial fields. Among them, one device that has been proposed is a semiconductor laser module storing a semiconductor laser in a package constituted of a bottom plate formed of a material having high thermal conductivity functioning as a heat sink, a resin package peripheral wall with a metal film formed on the inner surface, and a lid.

SUMMARY

Japanese Patent Laid-Open Publication No. 2012-70007 describes that, even if heat generation occurs on the inner wall of the package due to a beam repeatedly reflected within the package without being emitted to the outside among the beams emitted from the semiconductor laser, heat is not transferred to the resin portion of the package by the metal film, and is discharged from the bottom plate functioning as a heat sink.

A metal film directly irradiated with a beam from the semiconductor laser is formed on the package peripheral wall and the inner surface of the lid. In this case, when the output of the semiconductor laser is large, heat that cannot be absorbed only by the metal film is transmitted to the package peripheral wall and the resin portion of the lid. Thus, decomposition of the resin constituting the package may occur, and organic gas may flow into the package. In semiconductor lasers, reliability drops remarkably in an organic gas environment.

In addition, Japanese Patent Laid-Open Publication No. 2012-70007 describes that a separate shielding plate is provided between the package peripheral wall and the lid, and the semiconductor laser. However, in this case, preparing a separate member increases the cost and complicates the production process.

One object of the present disclosure is to provide a light source device including a semiconductor laser, which is highly reliable and may be manufactured at low cost.

A light source device according to one aspect of the present invention comprises a base including a bottom portion and a peripheral wall portion, a semiconductor laser placed on the bottom portion, a cap connected to an upper surface of the peripheral wall portion, the cap configured to form a sealed space together with the base, a translucent portion provided in the peripheral wall portion or the cap, the translucent portion configured to transmit a beam emitted from the semiconductor laser, and two lead terminals configured to cross in the sealed space from one inner surface to another inner surface of the peripheral wall portion. The semiconductor laser is placed in a space between the two lead terminals, and the translucent portion is placed on an optical axis of a beam from the semiconductor laser.

As described above, according to the present disclosure, it is possible to provide a light source device including a semiconductor laser, which is highly reliable and may be manufactured at low cost.

BRIEF DESCRIPTION OF THE DRAWINGS

FIG. 12 is a schematic plan view showing the light source device according to the third embodiment of the present invention in a state before a cap is connected thereto.

DETAILED DESCRIPTION

Figure 1:
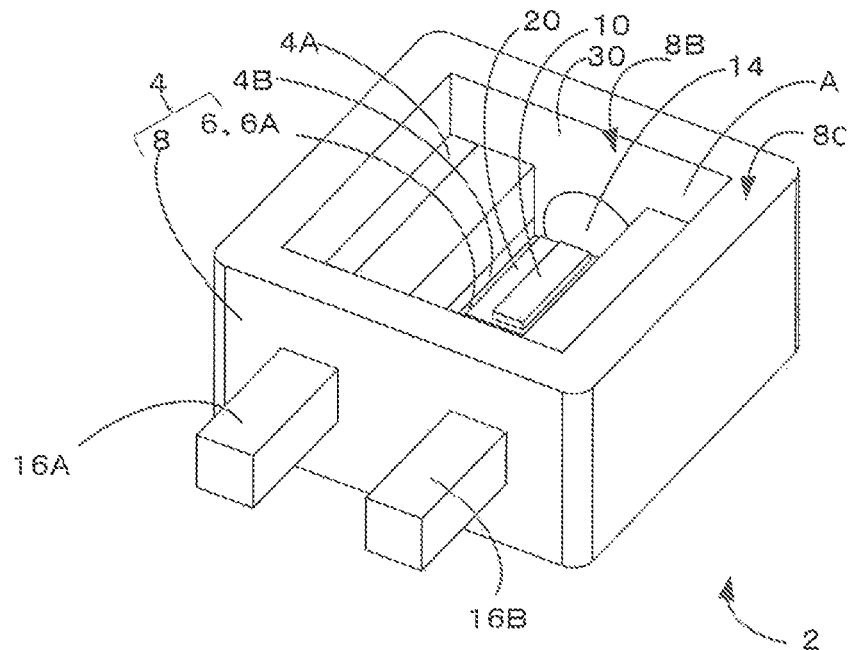
FIG. 1 is a schematic perspective view showing a light source device according to a first embodiment of the present invention in a state before a cap is connected thereto.

Hereinafter, embodiments of the present invention will be described with reference to the drawings. It should be noted that the light source devices described below are merely embodiments for illustrating the technical ideas of the present invention, and the present invention is not limited to those embodiments unless explicitly indicated.

In the drawings, members having the same function are given the same reference numeral. Although embodiments may be shown separately for convenience or easy of understanding, partial substitutions or combinations of configurations shown in different embodiments are possible. In the embodiments described below, descriptions of matters common to previously described embodiments will be omitted, and only different points will be described. In particular, similar functions and effects of similar configuration will not be repeatedly described in each embodiment. In some cases, the sizes and positional relationships of the members shown in each drawing are exaggerated, for clarity.

Light Source Device According to First Embodiment

Figure 2:
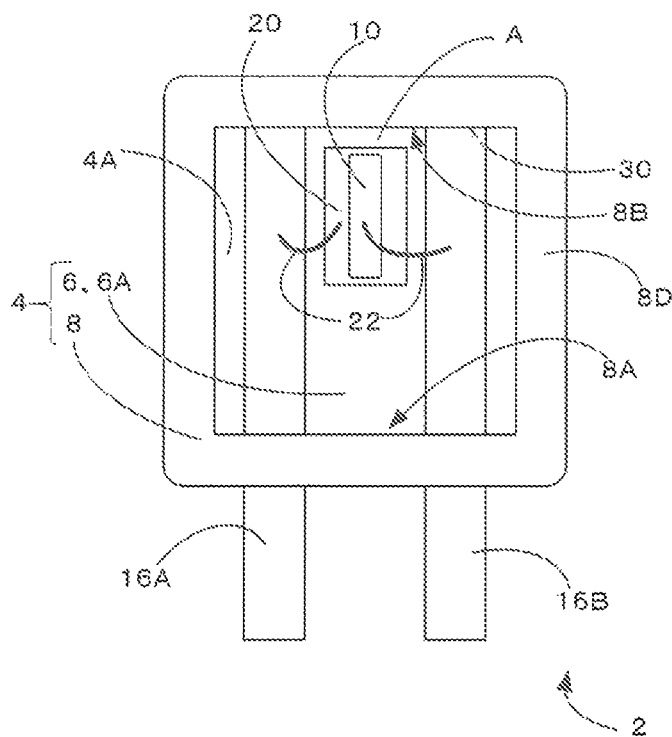
FIG. 2 is a schematic plan view showing the light source device according to the first embodiment of the present invention in a state before a cap is connected thereto.
Figure 3:
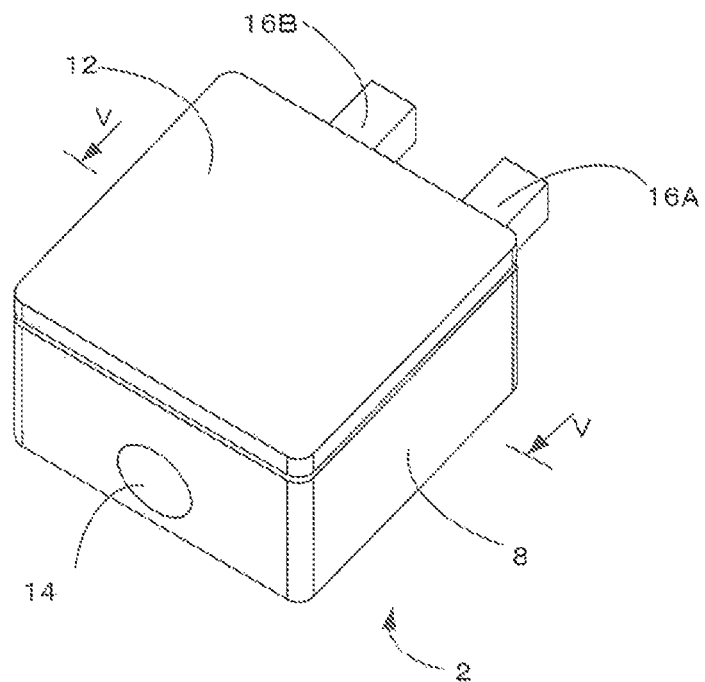
FIG. 3 is a schematic perspective view of the light source device according to the first embodiment of the present invention.
Figure 4:
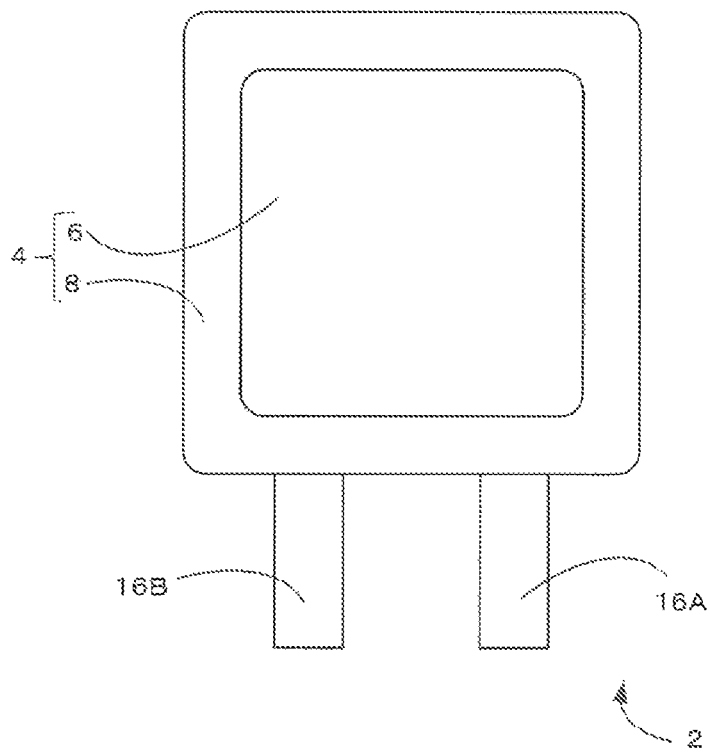
FIG. 4 is a schematic bottom view of the light source device according to the first embodiment of the present invention.
Figure 5:
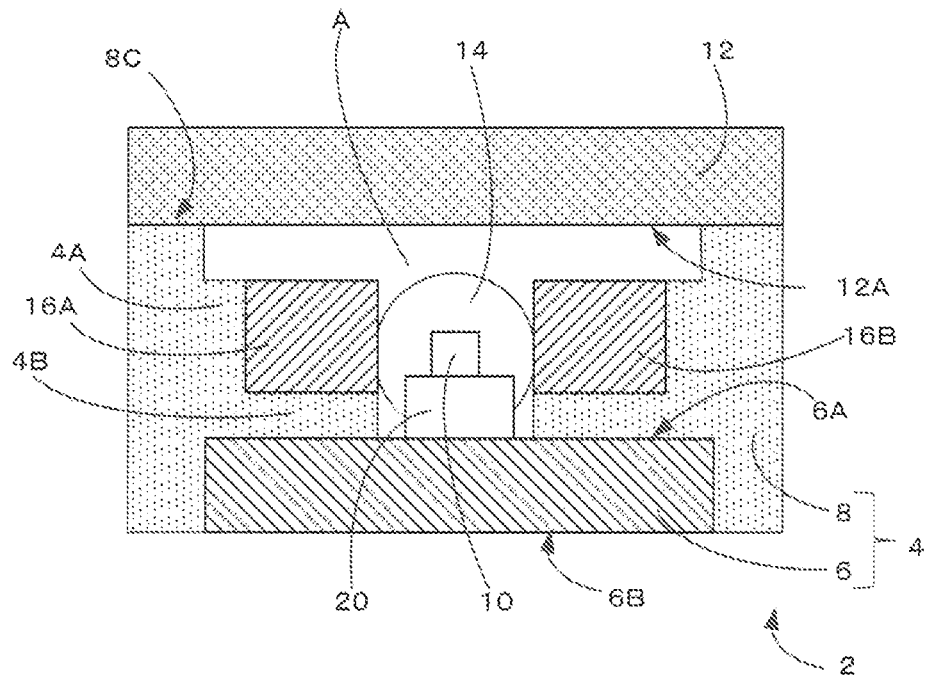
FIG. 5 is a cross-sectional view taken along line V-V in FIG. 3, and is a side sectional view showing the internal structure of the light source device according to the first embodiment of the present invention.

First, a light source device according to a first embodiment of the present invention will be described with reference to FIGS. 1 to 5. FIG. 1 is a schematic perspective view showing a light source device according to the first embodiment of the present invention in a state before a cap connected thereto, and FIG. 2 is a schematic plan view thereof. FIG. 3 is a schematic perspective view of the light source device according to the first embodiment of the present invention, and FIG. 4 is a schematic bottom view thereof. FIG. 5 is a cross-sectional view taken along line V-V in FIG. 3, and is a side sectional view showing the internal structure of the light source device according to the first embodiment of the present invention.

A light source device 2 according to the present embodiment includes a base 4 including a bottom portion 6 and a peripheral wall portion 8, and a semiconductor laser 10 placed on an upper surface 6A of the bottom portion 6. In addition, the light source device 2 includes a cap 12, connected to an upper surface 8C of the peripheral wall portion 8, for forming a sealed space A together with the base 4.

The peripheral wall portion 8 is connected to the side surface of the bottom portion 6 so as to surround the bottom portion 6. The base 4 may be formed, for example, by forming the bottom portion 6 of a metal material with high thermal conductivity, forming the peripheral wall portion 8 of a resin material, and integrally casting these members In the present embodiment, the bottom portion 6 and the peripheral wall portion 8 have a shape having a quadrangular outer edge in a top view, but the present disclosure is not limited thereto, and they may have any other shape including a circular or another polygonal shape.

Furthermore, the light source device 2 is provided with a peripheral wall portion 8, and the peripheral wall portion 8 includes a translucent portion 14 for transmitting a beam emitted from the semiconductor laser 10. The translucent portion 14 is placed on the optical axis of the beam from the semiconductor laser 10. With this arrangement, the beam emitted from the semiconductor laser 10 directly enters the translucent portion 14 and is transmitted therethrough.

Further, the light source device 2 includes two lead terminals 16A and 16B that cross the inside of a sealed space A from one inner surface 8A to the other inner surface 8B of the peripheral wall portion 8. More specifically, the two lead terminals 16A and 16B penetrate the peripheral wall portion 8 from the outside of the peripheral wall portion 8, cross the inside of the sealed space A from one inner surface 8A of the peripheral wall portion 8, and reach the other inner surface 8B of the peripheral wall portion 8.

The semiconductor laser 10 is placed in the space between the two lead terminals 16A and 16B. The lead terminals 16A and 16B are placed so as to be substantially parallel to the emission direction of the semiconductor laser 10, and the lead terminals 16A and 16B are placed so as to surround the side surface portion of the semiconductor laser 10. Then, the lead terminals 16A and 16B extend to the other inner surface 8B of the peripheral wall portion 8 serving as an emission surface provided with the translucent portion 14.

With this arrangement, a beam is emitted from the semiconductor laser 10 in a direction substantially parallel to the upper surface 6A of the bottom portion 6 and the side surfaces of the lead terminals 16A and 16B, enters the translucent portion 14 provided in the peripheral wall portion 8, and passes through the translucent portion 14 to be emitted to the outside of the light source device 2.

The beam emitted from the semiconductor laser 10 passes through the translucent portion 14 and is emitted to the outside of the light source device 2, but a part of the beam is reflected inside the sealed space A by the translucent portion 14. If the reflected beam directly enters the peripheral wall portion 8 of the base 4 formed of a resin material, the peripheral wall portion 8 may be deteriorated at an early stage.

In the present embodiment, the two lead terminals 16A and 16B cross the inside of the sealed space A from one inner surface 8A to the other inner surface 8B of the peripheral wall portion 8, the semiconductor laser 10 is placed in the space between the two lead terminals 16A and 16B, and the translucent portion 14 is placed on the optical axis of the beam from the semiconductor laser 10. Therefore, due to the shielding effect of the two lead terminals 16A and 16B, the beam reflected from the translucent portion 14 and the beam further reflected may be effectively suppressed from directly entering the peripheral wall portion 8. Thus, degradation due to laser beams may be suppressed without a special heat-resistant resin material being used for the peripheral wall portion 8. In addition, since the lead terminals 16A and 16B shield the beam from the semiconductor laser 10, there is no need to provide a separate component, and cost reduction may be achieved.

In particular, in the present embodiment, the translucent portion 14 is provided in the peripheral wall portion 8 and the beam emitted from the semiconductor laser 10 directly enters the translucent portion 14, and the lead terminals 16A and 16B extended to the other inner surface 8B of the peripheral wall portion 8. Accordingly, the beam reflected from the translucent portion 14 and the beam further reflected are effectively suppressed from directly entering the peripheral wall portion 8.

Further, a reflective layer 30 may be provided on the inner wall of the peripheral wall portion 8 including one inner surface 8A and the other inner surface 8B. Thus, a resin layer may be prevented from being irradiated by a beam which cannot be reflected or absorbed only by the lead terminals 16A and 16B, and reliability may be improved. It should be noted that, in order to prevent a short circuit, it is necessary that the reflective layer 30 is provided so as not to come into contact with the lead terminals 16A and 16B. The reflective layer 30 is more effectively provided in the vicinity of the translucent portion from which a beam is emitted or in the vicinity of the reflection mirror 40 described below, in the inner wall of the peripheral wall portion 8.

From the viewpoint of function of the bottom portion 6, which acts as a heat sink for efficiently radiating the heat generated by the semiconductor laser 10, it is preferable that the bottom portion 6 is formed of a metal material having high thermal conductivity. Specifically, the metal material may include copper or a copper alloy, and gold plating may be applied to the surface thereof. However, the material used for the bottom portion 6 is not limited thereto, and any other metal material including aluminum may be adopted. Furthermore, depending on the temperature condition, the bottom portion 6 may also be formed of a material such as a resin material or ceramic having relatively high thermal conductivity.

For the purpose of radiating heat, the lower surface 6B of the bottom portion 6 is preferably attached to a radiator such as a heat radiating plate with a heat sink. The radiator and the lower surface 6B of the bottom portion 6 may be connected with grease.

The peripheral wall portion 8 is preferably formed of a resin material from the viewpoint of integral casting with the bottom portion 6, the translucent portion 14, and the lead terminals 16A and 16B. Examples of the resin material to be used include thermosetting resins such as epoxy-based and phenol-based and thermoplastic resins such as polyether ether ketone (PEEK), liquid crystal polymer (LCP), and polyimide (PI).

The translucent portion 14 may be a member having translucency and is preferably made of glass such as borosilicate glass. An antireflection film is preferably provided on the surface on the semiconductor laser 10 side of the translucent portion 14.

The lead terminals 16A and 16B are preferably formed of a metal material having high electric conductivity and thermal conductivity. Specifically, copper or a copper alloy may be included. Gold plating may be applied to the surface. The lead terminals 16A and 16B according to the present embodiment have a quadrangular cross-sectional shape. However, the present disclosure is not limited thereto, and from the viewpoint of preventing the beam reflected from the translucent portion 14 from directly entering the peripheral wall portion 8, the side surfaces on both sides of the semiconductor laser 10 are preferably planar, but it is possible to have any cross-sectional shape in a range satisfying the requirement.

In the present embodiment, the end surfaces of the two lead terminals 16A and 16B are placed so as to be in contact with the other inner surface 8B, but the present disclosure is not limited thereto, and there may be cases where the two lead terminals 16A and 16B extend from the other inner surface 8B to the inside of the peripheral wall portion 8. Furthermore, also on the other inner surface 8B side, there may be cases where the two lead terminals 16A and 16B protrude from the peripheral wall portion 8 to the outside, that is, the two lead terminals 16A and 16B penetrate the peripheral wall portion 8 on both sides of the peripheral wall portion 8.

As the semiconductor laser 10 according to the present embodiment, a nitride semiconductor laser element having an oscillation wavelength from the ultraviolet light region to the green light region may be used. However, the present disclosure is not limited thereto, and any other semiconductor laser element having other wavelength ranges may be adopted.

The semiconductor laser 10 is preferably installed on the bottom portion 6 via the sub-mount 20. The sub-mount 20 is preferably made of a material having high electrical insulating properties and high thermal conductivity. Specifically, aluminum nitride or silicon carbide may be exemplified. The sub-mount 20 is provided with a metal film on the front and back surfaces, and on the surfaces of the metal film, one surface is fixed to the semiconductor laser 10 and the other surface is fixed to the bottom portion 6.

As shown in FIG. 2, the positive electrode placed on the upper surface of the semiconductor laser 10 and the lead terminal 16B are electrically connected with a wire 22, and the negative electrode placed on the lower surface of the semiconductor laser 10 and the lead terminal 16A are electrically connected with the wire 22 via a wiring line formed in the sub-mount 20. Thus, electric power from the outside is supplied to the semiconductor laser 10 through the lead terminals 16A and 16B and the wire 22, and the semiconductor laser 10 emits a beam. It should be noted that in FIGS. 1 and 5, in order to clearly show other members, display of wires is omitted.

The connection method between the semiconductor laser 10 and the lead terminals 16A and 16B is not limited to the above, and positive and negative electrodes placed on one surface of the semiconductor laser 10 and the sub-mount 20 may be connected by flip chip connection, and the sub-mount 20 and the lead terminals 16A and 16B may be connected with the wire 22.

In the present embodiment, as shown in FIGS. 1 and 5, the integrally cast base 4 is provided with a first protrusion 4A made of a resin in contact with the side surfaces of the lead terminals 16A and 16B and a second protrusion 4B made of a resin in contact with the lower surfaces of the lead terminals 16A and 16B and the upper surface of the bottom portion 6 as a part of the peripheral wall portion 8. Thus, the contact ability between the integrally cast base 4 (peripheral wall portion 8) and the lead terminals 16A, 16B may be increased, and a highly reliable light source device may be achieved. In addition, a short circuit between the lead terminals 16A and 16B and the bottom portion 6 is prevented by the second protrusion 4B, and sufficient airtightness is secured.

Further, in the bottom portion 6, the translucent portion 14, and the lead terminals 16A and 16B, it is preferable that concave and convex portions are provided on the contact surface with the peripheral wall portion 8. This allows increasing the contact area between the bottom portion 6, the translucent portion 14, and the lead terminals 16A and 16B, and the peripheral wall portion 8 when integral casting is performed, and improving the contact ability, thereby improving the sealing performance.

Light Source Device According to Second Embodiment

Figure 6:
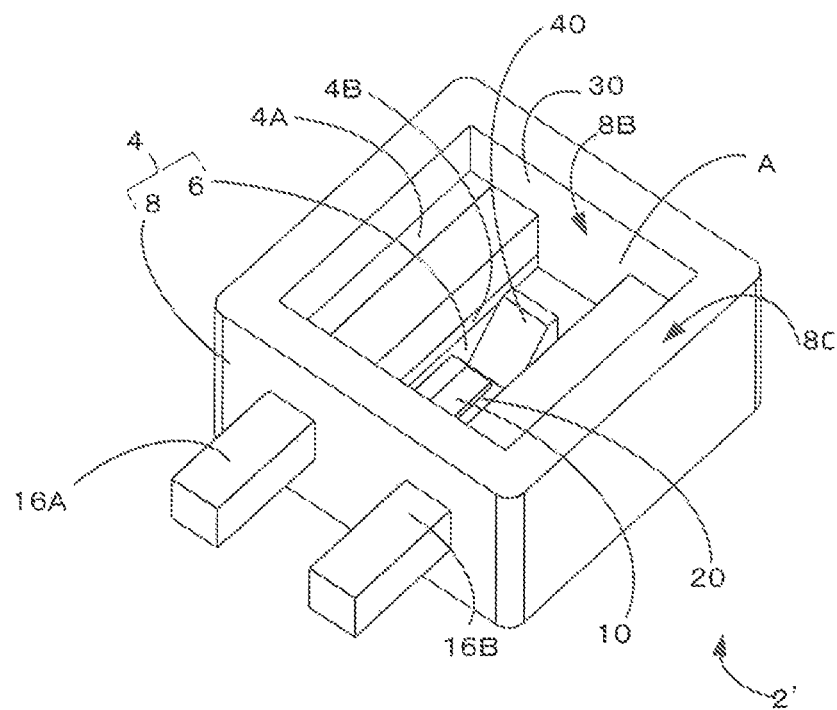
FIG. 6 is a schematic perspective view showing a light source device according to a second embodiment of the present invention in a state before a cap is connected thereto.
Figure 7:
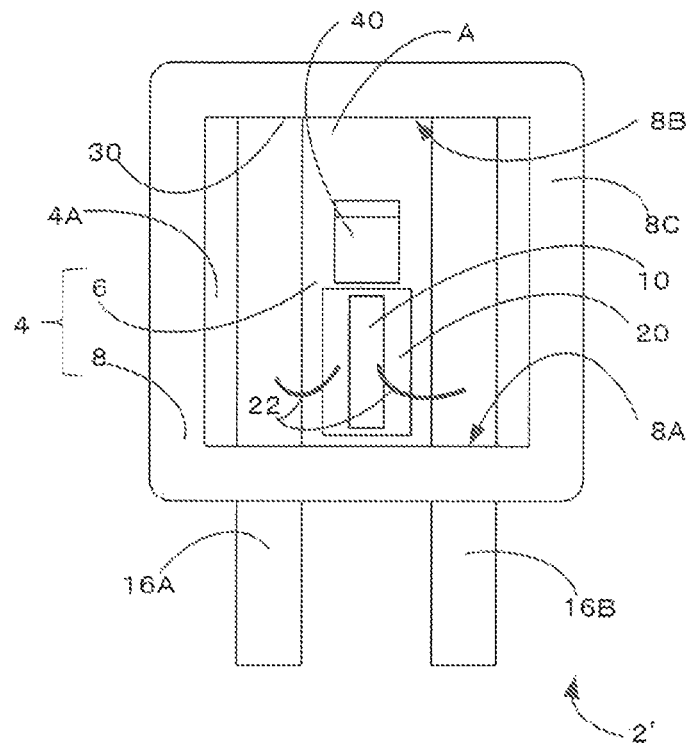
FIG. 7 is a schematic plan view showing the light source device according to the second embodiment of the present invention in a state before a cap is connected thereto.
Figure 8:
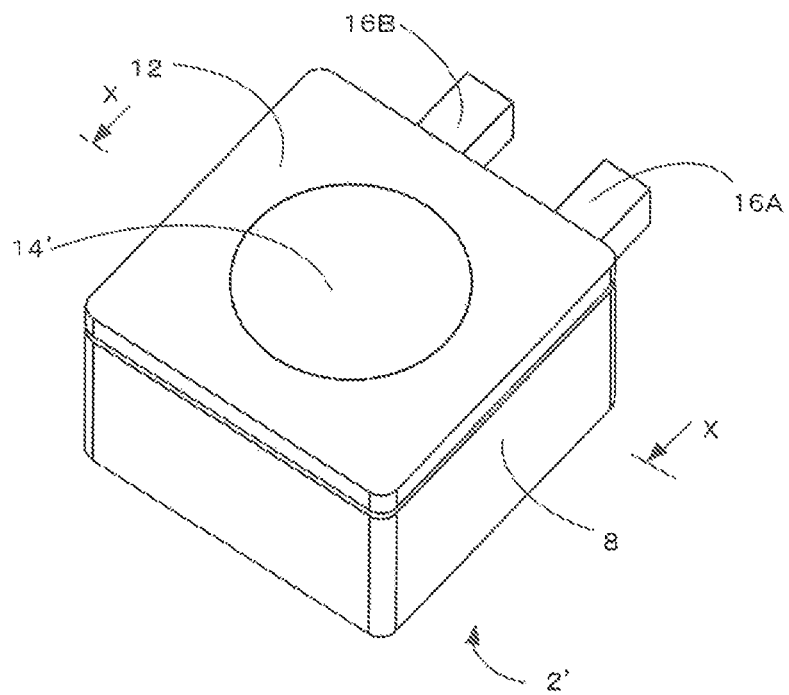
FIG. 8 is a schematic perspective view of the light source device according to the second embodiment of the present invention.
Figure 9:
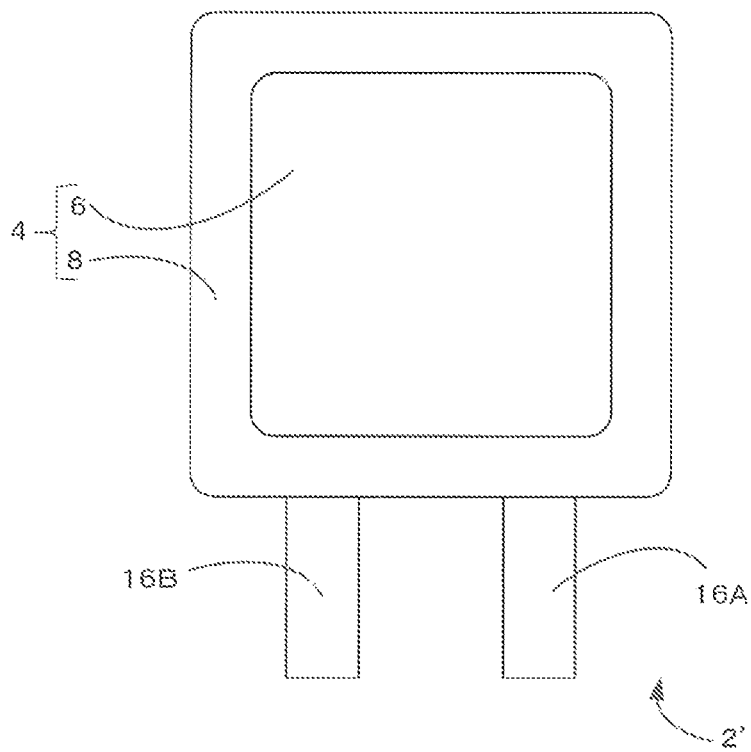
FIG. 9 is a schematic bottom view of the light source device according to the second embodiment of the present invention.
Figure 10:
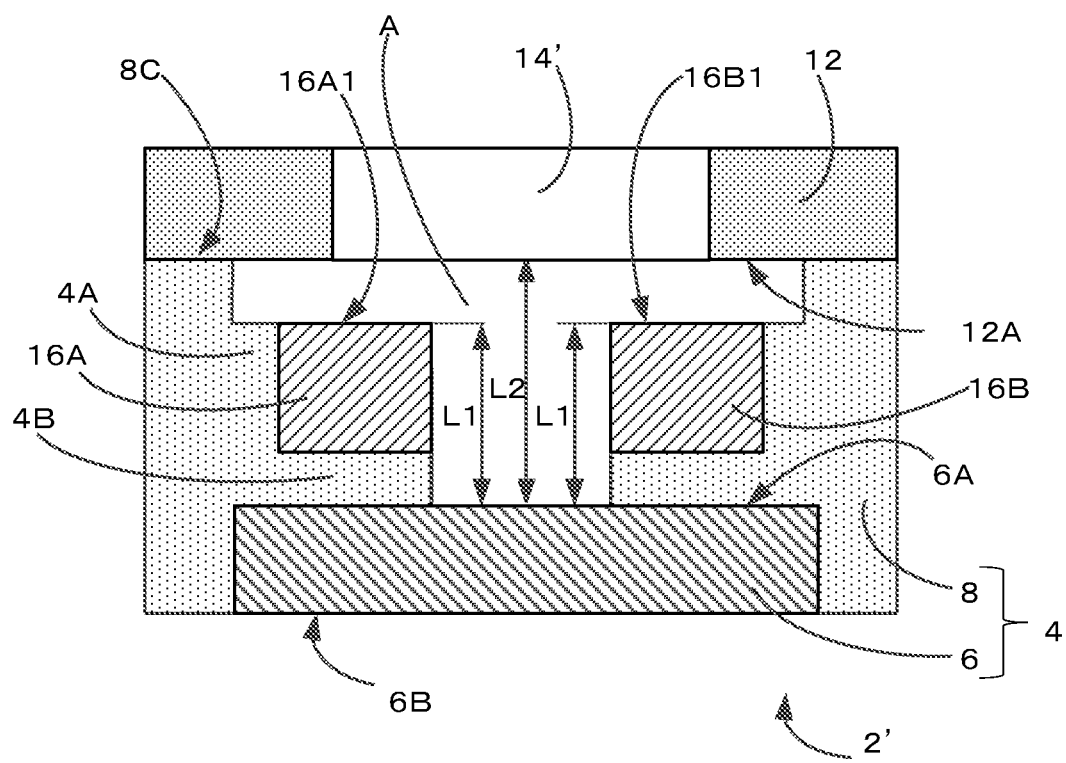
FIG. 10 is a cross-sectional view taken along line X-X in FIG. 8, and is a side sectional view showing the internal structure of the light source device according to the second embodiment of the present invention.

Next, a light source device according to a second embodiment of the present invention will be described with reference to FIGS. 6 to 10. FIG. 6 is a schematic perspective view showing a light source device according to the second embodiment of the present invention in a state before a cap is connected thereto, and FIG. 7 is a schematic plan view thereof. FIG. 8 is a schematic perspective view of the light source device according to the second embodiment of the present invention, and FIG. 9 is a schematic bottom view thereof. FIG. 10 is a cross-sectional view taken along line X-X in FIG. 8, and is a side sectional view showing the internal structure of the light source device according to the second embodiment of the present invention. It should be noted that in FIG. 10, in order to clearly show other members, the display of the reflection mirror is omitted.

A light source device 2' according to the second embodiment is different from the light source device 2 according to the first embodiment in that a reflection mirror 40 is installed on the upper surface of the bottom portion 6, adjacent to the semiconductor laser 10, and a translucent portion 14' is provided not in the peripheral wall portion 8 but in the cap 12. The reflection mirror 40 has a reflection surface inclined about 45 degrees with respect to the upper surface 6A of the bottom portion 6. The translucent portion 14 is placed on the optical axis of the reflected beam from the reflection mirror 40.

With this arrangement, a beam is emitted from the semiconductor laser 10 in a direction substantially parallel to the upper surface of the bottom portion 6 and the side surfaces of the lead terminals 16A and 16B, and is incident on the reflection mirror 40. The beam reflected by the reflection mirror 40 in the direction substantially perpendicular to the upper surface 6A of the bottom portion 6 enters the translucent portion 14' provided in the cap 12, passes through the translucent portion 14', and is emitted to the outside of the light source device 2'. As described above, also in the present embodiment, it may be said that the translucent portion 14' is placed on the optical axis of the beam from the semiconductor laser 10.

The beam emitted from the semiconductor laser 10 passes through the translucent portion 14' and is emitted to the outside of the light source device 2, but a part of the beam is reflected inside the sealed space A by the translucent portion 14'. If the reflected beam directly enters the peripheral wall portion 8 of the base 4 formed of a resin material, the peripheral wall portion 8 may be deteriorated at an early stage.

Also in the present embodiment, the semiconductor laser 10 is placed in the space between the two lead terminals 16A and 16B, and the translucent portion 14' provided in the cap is placed on the optical axis of the beam from the semiconductor laser, and in particular, on the optical axis of the reflected beam by the reflection mirror 40. Therefore, due to the shielding effect of the two lead terminals 16A and 16B, the beam reflected from the translucent portion 14' and the beam further reflected may be effectively suppressed from directly entering the peripheral wall portion 8.

Furthermore, as shown in FIG. 10, assuming that the distance from the upper surface 6A of the bottom portion 6 to the upper surfaces 16A1 and 16B1 of the lead terminals 16A and 16B is L1, and the distance from the upper surface 6A of the bottom portion 6 to the lower surface 12A of the cap 12 (that is, the upper surface 8C of the side wall portion 8) is L2, it is preferable that L1/L2>0.7, more preferable that L1/L2>0.8, and still more preferable that L1/L2>0.9.

Thus, the beam reflected from the translucent portion 14' and the beam further reflected may be more reliably suppressed from directly entering the peripheral wall portion 8.

In addition, similarly to the above, providing the reflective layer 30 on the inner wall of the peripheral wall portion 8 including one inner surface 8A and the other inner surface 8B may prevent a resin layer from being irradiated by a beam which cannot be reflected or absorbed only by the lead terminals 16A and 16B, and may improve reliability.

Light Source Device According to Third Embodiment

Figure 11:
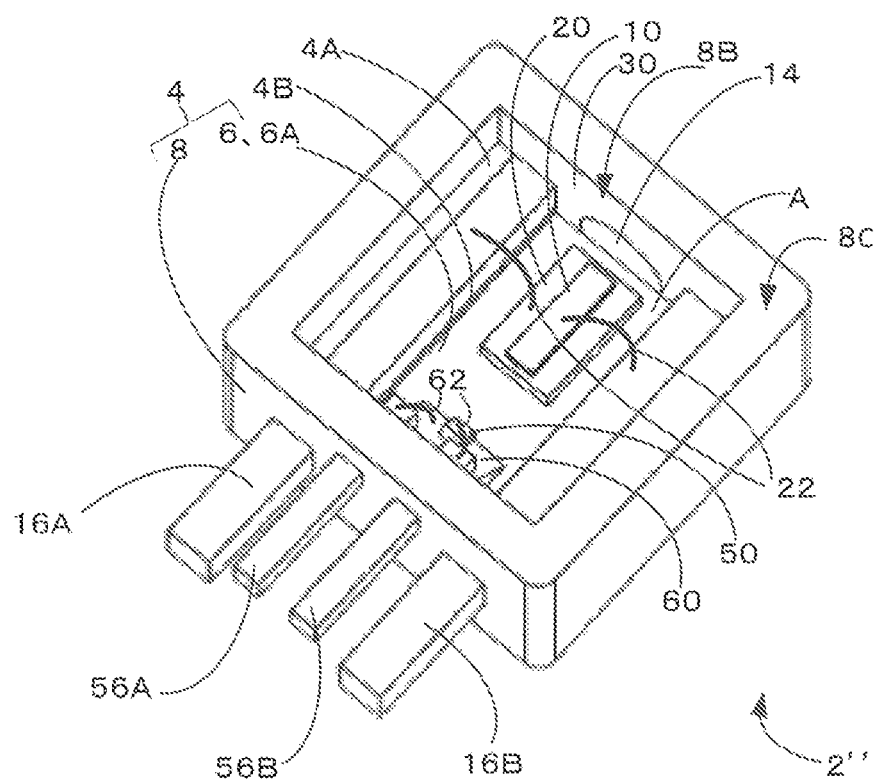
FIG. 11 is a schematic perspective view showing a light source device according to a third embodiment of the present invention in a state before a cap is connected thereto.

Next, a light source device according to a third embodiment of the present invention will be described with reference to FIGS. 11 and 12. FIG. 11 is a schematic perspective view showing a light source device according to the third embodiment of the present invention in a state before a cap is connected thereto. FIG. 12 is a schematic plan view showing the light source device according to the third embodiment of the present invention in a state before a cap is connected thereto. FIG. 11 is a perspective view seen from the direction corresponding to that of FIG. 1. FIG. 12 is a plan view seen from the direction corresponding to that of FIG. 2.

In the light source device 2" according to the third embodiment of the present invention, a photo diode 50 for monitoring an output of a semiconductor laser 10 is provided in addition to the configurations of the light source device 2 according to the first embodiment of the present invention as described in FIGS. 1 to 5 above. In more detail, the photo diode 50 is installed on an upper surface 6a of a bottom portion 6 via a sub-mount 60. The light source device 2" is provided with lead terminals 56A, 56B for supplying electric power to the photo diode 50. An electrode placed on an upper surface of the photo diode 50 and the lead terminal 56B are electrically connected with a wire 62. An electrode placed on an bottom surface of the photo diode 50 and the lead terminal 56A are electrically connected with a wire 62 via a conductive layer formed on an upper surface of the sub-mount 60.

Since the other configurations of the present embodiment are basically the same as those of the light source device 2 according to the first embodiment as described above, further explanation will be omitted. The light source device 2' according to the second embodiment as described in FIGS. 6 to 10 above can also be provided with a photo diode.

Although certain embodiments and aspects of the present invention are described above, the details of the configurations may be varied, and combinations of elements or changes in order of elements in the embodiments and aspects may be achieved without departing from the scope and spirit of the present invention as claimed.

The light source device of the present disclosure may be used for various light sources such as a projector, a light source for a backlight of a liquid crystal, a light source for illumination, a light source for various indicators, a light source for a vehicle, a light source for a display, and a traffic light.

What is claimed is:

1. A light source device comprising:
   a base comprising:
      a bottom portion,
      a peripheral wall portion that surrounds and contacts outer lateral surfaces of the bottom portion, wherein the peripheral wall portion includes a first inner lateral surface, a second inner lateral surface that is opposite the first inner lateral surface, a third inner lateral surface, and a fourth inner lateral surface that is opposite the third inner lateral surface,
      a first upper protrusion that extends inward from the third inner lateral surface, and extends from the first inner lateral surface to the second inner lateral surface,
      a first lower protrusion that extends inward from the third inner lateral surface beyond the first upper protrusion, extends from the first inner lateral surface to the second inner lateral surface, and contacts an upper surface of the bottom portion,
      a second upper protrusion that extends inward from the fourth inner lateral surface of the peripheral wall portion, and extends from the first inner lateral surface to the second inner lateral surface, and
      a second lower protrusion that extends inward from the fourth inner lateral surface of the peripheral wall portion beyond the second upper protrusion, extends from the first inner lateral surface to the second inner lateral surface, and contacts the upper surface of the bottom portion,
      wherein (i) a distance from the upper surface of the bottom portion to an upper surface of the first upper protrusion, and (ii) a distance from the upper surface of the bottom portion to an upper surface of the second upper protrusion, are less than (iii) a distance from the upper surface of the bottom portion to the upper surface of the peripheral wall portion, wherein the peripheral wall portion, the first upper protrusion, the second upper protrusion, the first lower protrusion, and the second lower protrusion are formed as a single monolithic structure made of resin material, and wherein the bottom portion is formed of a metal material;

a semiconductor laser installed on the upper surface of the bottom portion via a sub-mount;

a cap connected to an upper surface of the peripheral wall portion, wherein the cap and the base define a sealed space;

a translucent portion located in the peripheral wall portion or the cap, the translucent portion being configured to transmit a beam emitted from the semiconductor laser; and first and second lead terminals located in the sealed space and crossing from the first inner lateral surface of the peripheral wall portion to the second inner lateral surface of the peripheral wall portion, such that the first and second lead terminals reach the second inner lateral surface, wherein the first lead terminal contacts an inner lateral surface of the first upper protrusion and an upper surface of the first lower protrusion, and the second lead terminal contacts an inner lateral surface of the second upper protrusion and an upper surface of the second lower protrusion, wherein the semiconductor laser is located between the first and second lead terminals, and wherein (i) a distance from an upper surface of the bottom portion to an upper surface of the first lead terminal and (ii) a distance from the upper surface of the bottom portion to an upper surface of the second lead terminal, are greater than (iii) a distance from the upper surface of the bottom portion to an upper surface of the semiconductor laser.

2. The light source device according to claim 1, wherein the translucent portion is located in the peripheral wall portion, and the beam emitted from the semiconductor laser directly enters the translucent portion.

3. The light source device according to claim 1, wherein the translucent portion is located in the cap, the beam emitted from the semiconductor laser is reflected by a reflection surface, and the reflected beam enters the translucent portion, and wherein the translucent portion is located on an optical axis of the beam reflected by the reflection surface.

4. The light source device according to claim 3, wherein:
  a ratio of (i) the distance from the upper surface of the bottom portion to the upper surface of the first lead terminal to (ii) a distance from the upper surface of the bottom portion to a lower surface of the cap, is less than 1 and greater than 0.8, and
  a ratio of (i) the distance from the upper surface of the bottom portion to the upper surface of the second lead terminal to (ii) the distance from the upper surface of the bottom portion to the lower surface of the cap, is less than 1 and greater than 0.8.

5. The light source device according to claim 1, wherein a reflective layer is located on an inner wall of the peripheral wall portion, and the reflective layer is not in contact with the lead terminals.

6. The light source device according to claim 1, wherein, in the bottom portion, the lead terminals, and the translucent portion, concave and convex portions are located on surfaces that contact the peripheral wall portion.

7. The light source device according to claim 1, wherein the light source device further comprises a photo diode.

8. The light source device according to claim 7, wherein the light source device further comprises lead terminals for supplying electric power to the photo diode.

9. The light source device according to claim 1, wherein the first and second inner lateral surfaces of the peripheral wall portion are planar surfaces.

10. The light source device according to claim 1, wherein the first and second lead terminals cross linearly from the first inner lateral surface of the peripheral wall portion to the second inner lateral surface of the peripheral wall portion that is opposite to the first inner lateral surface.

* * * * *